(12) United States Patent
Kamath et al.

(10) Patent No.: US 12,073,903 B1
(45) Date of Patent: Aug. 27, 2024

(54) METHOD AND SYSTEM FOR ESTIMATING AND COMPENSATING FOR LEAKAGE CURRENT IN MEMORY UNIT CELLS

(71) Applicant: Meta Platforms Technologies, LLC, Menlo Park, CA (US)

(72) Inventors: Umanath Ramachandra Kamath, Palo Alto, CA (US); Ali Mesgarani, Sunnyvale, CA (US); Robert Wiser, Palo Alto, CA (US)

(73) Assignee: Meta Platforms Technologies, LLP, Menlo Park, CA (US)

( * ) Notice: Subject to any disclaimer, the term of this patent is extended or adjusted under 35 U.S.C. 154(b) by 0 days.

(21) Appl. No.: 18/172,983

(22) Filed: Feb. 22, 2023

(51) Int. Cl.
  *G11C 29/00* (2006.01)
  *G11C 29/50* (2006.01)
(52) U.S. Cl.
  CPC .. *G11C 29/50004* (2013.01); *G11C 29/50016* (2013.01)
(58) Field of Classification Search
  CPC ........ G11C 29/50004; G11C 29/50012; G11C 29/50016; G11C 2029/5004; G11C 2029/5006
  See application file for complete search history.

(56) References Cited

U.S. PATENT DOCUMENTS

| | | | |
|---|---|---|---|
| 7,508,697 B1* | 3/2009 | Mukhopadhyay ... | G11C 29/028 365/189.09 |
| 2017/0131924 A1* | 5/2017 | Main .................. | G06F 11/3034 |
| 2020/0105345 A1* | 4/2020 | Baek ..................... | G11C 7/04 |

* cited by examiner

*Primary Examiner* — Christine T. Tu
(74) *Attorney, Agent, or Firm* — Greenberg Traurig, LLP

(57) ABSTRACT

A method may be performed by a leakage monitoring and compensation system configured to estimate and compensate for leakage current in memory unit cells. The method may include identifying a leakage monitoring component associated with a memory unit cell. Further, the method may include sampling multiple leak events during a first exposure window. The method may include storing a first count representing the plurality of leak events sampled during the first exposure window. Each leak event may correspond to a unit of memory leakage. The method may include sampling multiple sensing events during a second exposure window. The method may include detecting a second count representing the sensing events sampled during the second exposure window. The method may include determining a compensation value representing a difference between the first count and the second count.

20 Claims, 8 Drawing Sheets

METHOD AND SYSTEM FOR ESTIMATING AND COMPENSATING FOR LEAKAGE CURRENT IN MEMORY UNIT CELLS

TECHNICAL FIELD

The present disclosure generally relates to systems and methods for estimating and compensating leakage in memory unit cells.

BACKGROUND

Leakage current is a current that leaks from circuits to ground and/or a device casing/chassis. The leakage current may flow from an input or an output. Leakage current may occur even in circuits that are properly grounded when changes in voltage occur at different portions of the circuit. In integrated circuits, leakage current may occur between electronic elements connected to one another. In some cases, leakage current may occur even within a single electronic element.

Memory storing devices may be affected by leakage current to the extent that leaked currents cause information stored in these devices to deteriorate. The deterioration of information may significantly shorten a durable life cycle of any given memory storing device. In some cases, the deterioration of information may impact a functionality of an electronic device including the memory storing device. For example, a depth sensor that relies on information stored in a memory to calculate a distance between two objects may not provide the distance correctly if the information is deteriorated due to leakage currents.

SUMMARY OF THE DISCLOSURE

Memory storing devices may suffer from leakage currents during idle times. Leakage currents may be currents that cause a memory storing device to lose information over time. In particular, the leakage current may cause information stored in a given memory storing device to deteriorate. As current leaks from the memory storing device, the information is lost. For example, a memory storing device represented by a charged capacitor may lose a charge via a leakage current in a connection between one of its terminals. In this example, the leakage current may cause the capacitor to discharge. The unintended discharging of the capacitor via the leakage current causes the original charge in the capacitor to decrease. In this example, the charge (i.e., or a corresponding voltage value) is the information held by the capacitor and this information deteriorates over time as the leakage current discharges the capacitor.

Discharging a given pre-charged (or reset) capacitor in successive sequence by a fixed amount of reference charge may be used in sensor interfaces or data conversion applications. In these applications, a time between successive discharge events may be long. Any leakage current during the time may deteriorate the information stored on the capacitor while impacting a Signal-to-Noise ratio.

In some embodiments, a method and system described herein are configured to estimate and compensate for leakage current in memory unit cells. The memory storing capabilities of the memory unit cells may be represented by a capacitor. The method and system comprise structural elements that are integrated into a practical application of reducing an impact of leakage current in the memory unit cells without making any modifications to the materials comprising individual cells. Further, the method and system are integrated into a practical application of reducing information deterioration by compensating the impact of leakage current in the memory unit cells irrespective of temperature changes. Additionally, the technical solutions described herein estimate and compensate for leakage current in pre-fabrication circuits and fabricated circuit dies. In some embodiments, the leakage current is implemented for any sensor read-out configuration or for charge domain readout in addition to the memory unit cells.

In one or more embodiments, a method is performed by a leakage monitoring and compensation system configured to estimate and compensate for leakage current in memory unit cells. The method includes identifying a leakage monitoring component associated with a memory unit cell. Further, the method includes sampling multiple leak events during a first exposure window. The first exposure window includes a first duration. The method includes storing a first count representing the plurality of leak events sampled during the first exposure window. Each leak event corresponds to a unit of memory leakage. The method includes sampling multiple sensing events during a second exposure window. The second exposure window includes a second duration. The method includes detecting a second count representing the sensing events sampled during the second exposure window. The method includes determining a compensation value representing a difference between the first count and the second count; storing the compensation value as a leakage-adjustment value in a temperature-specific leakage compensation table; and incorporating the temperature-specific leakage compensation table in a variable memory leakage compensation operation.

In some embodiments, a leakage monitoring and compensation system is configured to estimate and compensate for leakage current in memory unit cells. The leakage monitoring and compensation system includes a sensor, a leakage monitoring component, and a processor communicatively coupled to one another. The sensor includes multiple memory unit cells. Further, the leakage monitoring component is configured to sample multiple leak events during a first exposure window. The first exposure window includes a first duration. The leakage monitoring component is configured to store a first count representing the plurality of leak events sampled during the first exposure window. Each leak event corresponds to a unit of memory leakage. The leakage monitoring component is configured to sample multiple sensing events during a second exposure window. The second exposure window may include a second duration. The leakage monitoring component is configured to detect a second count representing the sensing events sampled during the second exposure window. Additionally, the processor may be configured to identify that the leakage monitoring component is associated with a specific memory unit cell of the memory unit cells. The processor is configured to determine a compensation value representing a difference between the first count and the second count; store the compensation value as a leakage-adjustment value in a temperature-specific leakage compensation table; and incorporate the temperature-specific leakage compensation table in a variable memory leakage compensation operation.

In yet other embodiments, a leakage monitoring and compensation system is configured to estimate and compensate for leakage current in memory unit cells. The leakage monitoring and compensation system includes a sensor, a leakage monitoring component, a processor, and a non-transitory computer readable medium communicatively coupled to one another. The sensor includes multiple memory unit cells. Further, the leakage monitoring component is configured to sample multiple leak events during a first exposure window. The first exposure window includes a first duration. The leakage monitoring component is configured to store a first count representing the plurality of leak events sampled during the first exposure window. Each leak event corresponds to a unit of memory leakage. The leakage monitoring component is configured to sample multiple sensing events during a second exposure window. The second exposure window may include a second duration. The leakage monitoring component is configured to detect a second count representing the sensing events sampled during the second exposure window. Additionally, the processor includes a processing engine configured to perform one or more operations upon executing one or more instructions. To this end, the non-transitory computer readable medium stores the one or more instructions that when executed by the processor cause the processor to identify that the leakage monitoring component is associated with a specific memory unit cell of the memory unit cells. The instructions cause the processor to determine a compensation value representing a difference between the first count and the second count; store the compensation value as a leakage-adjustment value in a temperature-specific leakage compensation table; and incorporate the temperature-specific leakage compensation table in a variable memory leakage compensation operation.

The embodiments disclosed herein are only examples, and the scope of this disclosure is not limited to them. Particular embodiments may include all, some, or none of the components, elements, features, functions, operations, or steps of the embodiments disclosed herein. Embodiments according to the invention are in particular disclosed in the attached claims directed to a method, a system, a storage medium, and a computer system, wherein any feature mentioned in one claim category (e.g., method) may be claimed in another claim category (e.g., system) as well. The dependencies or references back in the attached claims are chosen for formal reasons only. However any subject matter resulting from a deliberate reference back to any previous claims (i.e., in particular multiple dependencies) may be claimed as well, so that any combination of claims and the features thereof are disclosed and can be claimed regardless of the dependencies chosen in the attached claims. The subject-matter which may be claimed comprises not only the combinations of features as set out in the attached claims but also any other combination of features in the claims, wherein each feature mentioned in the claims may be combined with any other feature or combination of other features in the claims. Furthermore, any of the embodiments and features described or depicted herein may be claimed in a separate claim and/or in any combination with any embodiment or feature described or depicted herein or with any of the features of the attached claims.

DETAILED DESCRIPTION

In one or more embodiments, leakages are caused by a gradual loss of energy from a charged capacitor of a memory storing device. A leakage current may be caused by electronic devices attached to the capacitors, such as transistors or diodes, which may conduct a small amount of current even when they are turned off. As described above, even though certain electronic devices may be turned off, the leakage current may still slowly discharges the capacitor or the memory storing device. In some cases, a likelihood of leakage current increases proportionally with a temperature level. As such, electronic devices with higher internal temperatures are more likely to leak current while electronic devices with lower internal temperatures are less likely to leak current.

Herein, a method and system are configured to reduce estimate and compensate for leakage current in a circuit. In one or more embodiments, the method and system selectively estimate an amount of leaked current from specific memory storing devices. In estimating the amount of leaked current, the method and the system determine a loss in the information stored in the memory storing device. For example, a memory may be a capacitor with a leakage current that compromises information stored in the capacitor. In this case, the method and the system estimate an amount of current that leaks (i.e., leakage current) from the capacitor over a predetermined period of time. After the amount of leakage current is estimated, the method and the system generate a correction value that accounts for an expected information deterioration over the predetermined period of time. Once the correction value is determined, the method and the system use the correction value to correct (i.e., modify) any information sampled from the capacitor.

In one or more embodiments, the method and system may estimate leakage current during a pre-fabrication stage or a calibration stage in which circuits are tested for current leakage. In some embodiments, the method and system may compensate for the estimated leakage current dynamically during field applications of the circuits. In other embodiments, the method and system may estimate and compensate for the estimated leakage current dynamically during field applications of the circuits.

Previous technologies fail to provide efficient and reliable solutions to estimate and compensate for leakage current in memory unit cells. Embodiments of the present disclosure and its advantages may be understood by referring to FIGS. 1-8.

System Overview

Figure 1:
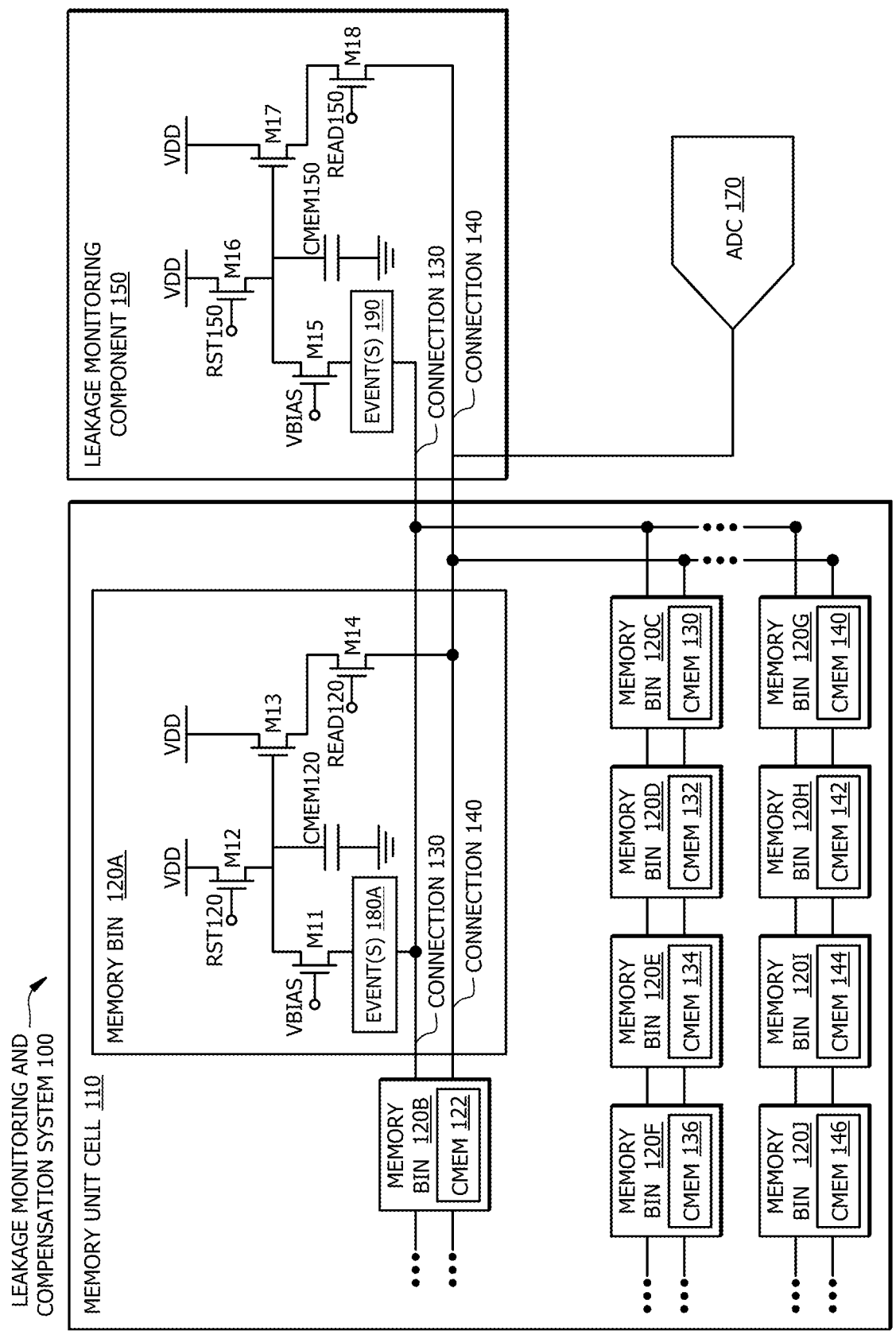
FIG. 1 is a hybrid block and circuit diagram illustrating a leakage monitoring and compensation system, in accordance with one or more embodiments.

FIG. 1 shows a leakage monitoring and compensating system 100 in accordance with one or more embodiments. The leakage monitoring and compensating system 100 includes a memory unit cell 110, a leakage monitoring component 150, and an Analog-to-Digital Convertor (ADC) 170 communicatively coupled to one another. The memory unit cell 110 and the leakage monitoring component 150 are connected via a connection 130. The memory unit cell 110, the leakage monitoring component 150, and the ADC 170 are connected via a connection 140. The memory unit cell 110, the leakage monitoring component 150, and the ADC 170 may be embedded in a same or different dies. In the leakage monitoring and compensating system 100, the memory unit cell 110 may be configured to receive and store information. The information may be in the form of a charge or a voltage kept (or released) upon receiving current from a substrate or a sensor configured to store charges or voltage corresponding to physical stimuli.

In the example of FIG. 1, the physical stimuli is shown as one or more events 180A inputs. The one or more events 180A are shown as being part of the memory bin 180A, but each of the memory bins 120B-120J shown in FIG. 1 may include a corresponding event input. Similarly, the physical stimuli is shown as one or more events 190 in the leakage monitoring component 150. In one or more embodiments, the one or more events 180 or 190 form a unique coupling with connection 130 to each of the memory bins 120A-120J and the leakage monitoring component 150.

In some embodiments, the leakage monitoring component 150 may be configured to estimate multiple and distinct instances of current leakage in the memory unit cell 110. The leakage monitoring component 150 may be configured to store and release information. The memory unit cell 110 and the leakage monitoring component 150 may provide the ADC 170 with analog signals of current or voltage that the ADC 170 may convert to digital signals counting a level of magnitude that is proportional to the analog signals received.

In one or embodiments, the memory unit cell 110 may be part of a memory array including multiple memory unit cells. The memory array may be part of a sensor configured to sense physical phenomena by generating multiple physical reactions in response to receiving physical stimuli. For example, in the case of a depth sensor, the physical phenomena is a distance between the depth sensor and surrounding objects (i.e., a depth) and the physical stimuli may be photons that are sensed by a photo-sensitive receiving material in the depth sensor. The sensed photons may be photons from a laser beam bouncing back in the environment and returning to the depth sensor. In this example, the multiple physical reactions may be multiple current or voltage values corresponding to a level of intensity of the depth perceived by the sensor. Each time one of the memory bins (collectively and for the sake of reference memory bins 120) senses an event, a memory capacitor (collectively and for the sake of reference memory capacitor CMEM) in the memory bin 120 is filled with a charge, like a bucket filling with water. In some embodiments, some current may be discharged or charged from the memory bin 120 in a case when a new photon hits a sensor.

In some embodiments, the leakage monitoring component 150 is configured to estimate and compensate the leakage current that memory capacitors CMEM may leak over time. In the context of the depth sensor example, photons are sensed as an "event." As described above, the depth sensor includes a corresponding memory array. Each memory array may include multiple memory unit cells that, in turn, include multiple memory bins 120. The events stored at the memory bins 120 may correspond to a signal histogram associating depth levels perceived from the sensed photons to current or voltage values in multiple signal strengths. Depending on a time in which each event arrives to the depth sensor, sensed events are stored into a memory bin 120 that corresponds to a particular position in the histogram. During an exposure period (i.e., a time in which the depth sensor is configured to sense events), the histogram may accumulate a distribution of detected events. The memory bin 120 with the most events may represent a time of flight of the photons bouncing back from the environment surrounding the depth sensor. In some embodiments, the memory unit cell 110 may store multiple times of flight.

To estimate the leakage current of an individual memory bin 120, the leakage monitoring component 150 may determine a charge change in the memory bin 120 while the memory bin 120 is expected to be in an idle state. If the idle state of the memory bin 120 is charged, then the leakage monitoring component 150 detects when a corresponding memory capacitor CMEM is being discharged in the idle state. The leakage monitoring component 150 may estimate the leakage current. Assuming that the leakage current remains constant over time, the leakage monitoring component 150 may generate a compensation table in which sensed events are brought back to their original value. For example, the leakage monitoring component 150 may estimate that the leakage current causes a specific memory bin 120 to discharge at a first rate while the specific memory bin 120 is expected to be in an idle state. In this example, leakage monitoring component 150 replaces one of the memory bins 120 as a dummy memory bin. Acting as a replacement, the leakage monitoring component 150 cooperates with the ADC 170 may be configured to determine that the first rate is 3 units (i.e., coulombs (C) or amperes per second (A/s)) over a first amount of time (i.e., time period). Herein, for the sake of brevity, these units are referred to as units of memory leakage. Upon detecting the first rate, the first rate may be stored as a first compensation value to modify subsequent sensing at the specific memory bin 120. In this regard, subsequent events sensed at the specific memory bin 120 may be corrected by 3 units of memory leakage when the memory bin 120 senses events over a time period equal to the first amount of time. One or more compensation values may be stored in compensation tables addressing corrections for multiple memory bins 120 and compensating for one or more histograms. An operational flow describing the estimation and compensation of the leakage current is described in detail in reference to FIG. 2.

In one or more embodiments, depending on one or more parameters (i.e., footprint on a die, cost, and the like) of an application: a single compensation value may be used for a group of memory bins 120 in a given memory unit cell 110, as it will be discussed in more detail in reference to FIG. 5; multiple compensation values may be used for a group of memory bins 120 in a given memory unit cell 110, as it will be discussed in more detail in reference to FIG. 6; and one or more compensation values may be used for a group of memory bins 120 in a given memory unit cell 110 that change based on a temperature surrounding the given memory unit cell 110, as it will be discussed in more detail in reference to FIG. 7.

System Elements

Memory Unit Cell

In the leakage monitoring and compensating system 100, the memory unit cell 110 may be configured to receive and store information. The information may be in the form of charges or voltage kept upon receiving current from a material configured to start a flow of current corresponding to physical stimuli. In some embodiments, and as described above, the memory unit cell 110 may be one of multiple memory unit cells in a memory array. In the example of FIG. 1, the memory unit cell 110 includes multiple memory bins 120A-120J. The memory bin 120A includes a transistor M11, a transistor M12, a transistor M13, a transistor M14, and a memory capacitor CMEM120.

In one or more embodiments, while only the memory bin 120A is shown in detail, the other memory bins 120B-120J may be configured to include identical elements to those shown in the memory bin 120A. In this regard, to show that the memory unit cell 110 may include an entire set of memory bins 120, the memory bin 120A is shown to include the memory capacitor CMEM120; the memory bin 120B is shown to include a memory capacitor CMEM122; the memory bin 120C is shown to include a memory capacitor CMEM130; the memory bin 120D is shown to include a memory capacitor CMEM132; the memory bin 120E is shown to include a memory capacitor CMEM134; the memory bin 120F is shown to include a memory capacitor CMEM136; the memory bin 120G is shown to include a memory capacitor CMEM140; the memory bin 120H is shown to include a memory capacitor CMEM142; the memory bin 120I is shown to include a memory capacitor CMEM144; and the memory bin 120J is shown to include a memory capacitor CMEM146. Further, although not explicitly shown, the memory bins 120A-120J may be configured to include elements similar to the transistor M11, the transistor M12, the transistor M13, and the transistor M14.

In the example of FIG. 1, the memory bins 120A-120J are coupled to one another via a connection 130 and a connection 140. Additionally, the connection 130 couples the memory bins 120A-120J to the leakage monitoring component 150. The connection 130 may charge or discharge the memory capacitors CMEM. Further, the connection 140 couples the memory bins 120A-120J to the leakage monitoring component 150 and the ADC 170. The connection 140 may supply a sample of the charge in the memory capacitors CMEM to the ADC 170.

In some embodiments, the memory bin 120A includes multiple inputs that are received from a processing device communicatively coupled to memory unit cell 110. The inputs provided by the processing device are shown as a bias voltage VBIAS, a reset pulse RST120, and a read pulse READ120. The bias voltage VBIAS may be a voltage received from a bias circuit to enable the use of the memory bin 120A. The reset pulse RST120 may be an input command received to reset a voltage of the memory capacitor CMEM120. The read pulse READ120 may be an input command received to enable reading of the charge in the memory capacitor CMEM120 to the ADC 170. An example of the bias circuit and an operational flow involving analogous inputs to the bias voltage VBIAS, the reset pulse RST120, and the read pulse READ12 are described in detail in relation to FIG. 2. An example of the processing device is described in detail in relation to FIG. 8.

In the memory bin 120A, a source of the transistor M11 is connected to the connection 130; a gate terminal of the transistor M11 is connected to a first input receiving the bias voltage VBIAS from a bias circuit; and a drain of the transistor M11 is connected to the transistor M12, the transistor M13, and the memory capacitor CMEM120. A source of the transistor M12 is connected to the drain of the transistor M11, the transistor M12, and the memory capacitor CMEM120; a gate terminal of the transistor M12 is connected to a second input receiving the reset pulse RST120 from the processing device; and a drain of the transistor M12 is connected to a voltage source VDD. A source of the transistor M13 is connected to the transistor M14; a gate terminal of the transistor M13 is connected to the drain of the transistor M11, a source of the transistor M12, and the memory capacitor CMEM120; and a drain of the transistor M13 is connected to the voltage source VDD. A source of the transistor M14 is connected to the connection 140; a gate terminal of the transistor M14 is connected to a third input receiving the read pulse READ120 from the processing device; and a drain of the transistor M14 is connected to the source of the transistor M13. A first terminal of the memory capacitor CMEM120 is connected to the drain of the transistor M11, the source of the transistor M12, and the gate of the transistor M13; and a second terminal of the memory capacitor CMEM120 is connected to ground.

In one or more embodiments, in the memory bin 120A, after RST120 is completed and based on one or more events 180A, the bias voltage VBIAS causes the transistor M11 to remove a specific charge from the memory capacitor CMEM120 given by a specific duration of time. In other embodiments, in the leakage monitoring component 150, after RST150 is completed and based on one or more events 190, the bias voltage VBIAS causes the transistor M15 to remove a specific charge from the memory capacitor CMEM150 given by a specific duration of time.

In one or more embodiments, the memory unit cell 110 is part of a memory array coupled to corresponding passive photodiodes which integrate charges during an exposure time of the sensor. The charges are then transferred to respective memory bins 120 in individual memory unit cells 110. Then, the stored charges are read by other electronic devices or components in the sensor. For example, in FIG. 1, the ADC 170 translates individual charges into voltages.

Leakage Monitoring Component

In one or more embodiments, the leakage monitoring component 150 includes every element described in reference to the memory bin 120A. In the example of FIG. 1, the leakage monitoring component 150 includes a transistor M15, a transistor M16, a transistor M17, a transistor M18, and a memory capacitor CMEM150. In FIG. 1, the leakage monitoring component 150 is coupled to the memory unit cell 110 via the connection 130. The leakage monitoring component 150 is coupled to the memory unit cell 110 and the ADC 170 via the connection 140. The connection 130 may be used to charge or discharge the memory capacitors CMEM150. The connection 140 may supply a sample of the charge in the memory capacitors CMEM150 to the ADC 170.

In some embodiments, the leakage monitoring component 150 includes multiple inputs that are received from the processing device. The inputs provided by the processing device are shown as a bias voltage VBIAS, a reset pulse RST150, and a read pulse READ150. The bias voltage VBIAS may be a voltage received from a bias circuit to enable the use of the leakage monitoring component 150. The reset pulse RST150 may be an input command received to reset a voltage of the memory capacitor CMEM150. The read pulse READ150 may be an input command received to enable reading of the charge in the memory capacitor CMEM150 to the ADC 170. An example of the bias circuit and an operational flow involving analogous inputs to the bias voltage VBIAS, the reset pulse RST120, and the read pulse READ12 are described in detail in relation to FIG. 2. An example of the processing device is described in detail in relation to FIG. 8.

In the leakage monitoring component 150, a source of the transistor M15 is connected to the connection 130; a gate terminal of the transistor M15 is connected to a first input receiving the bias voltage VBIAS from the bias circuit; and a drain of the transistor M15 is connected to the transistor M16, the transistor M17, and the memory capacitor CMEM150. A source of the transistor M16 is connected to the drain of the transistor M15, the transistor M17, and the memory capacitor CMEM150; a gate terminal of the transistor M16 is connected to a second input receiving the reset pulse RST150 from the processing device; and a drain of the transistor M16 is connected to the voltage source VDD. A source of the transistor M17 is connected to the transistor M18; a gate terminal of the transistor M17 is connected to the drain of the transistor M15, a source of the transistor M16, and the memory capacitor CMEM150; and a drain of the transistor M17 is connected to the voltage source VDD. A source of the transistor M18 is connected to the connection 140; a gate terminal of the transistor M18 is connected to a third input receiving the read pulse READ150 from the processing device; and a drain of the transistor M18 is connected to the source of the transistor M17. A first terminal of the memory capacitor CMEM150 is connected to the drain of the transistor M15, the source of the transistor M16, and the gate of the transistor M17; and a second terminal of the memory capacitor CMEM150 is connected to ground.

In one or more embodiments, the leakage monitoring component 150 is connected to multiple memory bins 120A-120J in the memory unit cell 110. In other embodiments, the leakage monitoring component 150 is connected to a portion (i.e., one or more, or all) of the multiple memory bins 120A-120J in the memory unit cell 110. In yet other embodiments, multiple leakage monitoring components 150 are connected to a portion (i.e., one or more, all) of the multiple memory bins 120A-120J in the memory unit cell 110. For example, in a first depth sensor including a first memory array with five memory unit cells 110, there may be five leakage monitoring components 150, such that there is one leakage monitoring component 150 per memory unit cell 110. In another example, in a second depth sensor including a second memory array with ten memory unit cells 110, there may be forty leakage monitoring components 150, such that there are four leakage monitoring component 150 per memory unit cell 110. In yet another example, in a third depth sensor including a third memory array with twenty memory unit cells 110, there may be two leakage monitoring components 150, such that there is one leakage monitoring component 150 per every ten memory unit cells 110. The changes in the numbers of the leakage monitoring components 150 per memory unit cell 110 may change based at least in part upon a predefined application configuration.

Analog-to-Digital Convertor

In one or more embodiments, the ADC 170 is configured to convert analog (i.e., continuous, infinitely variable) signals to digital (i.e., discrete-time, discrete-amplitude) signals. In some embodiments, the ADC 170 performs conversion by some form of quantization, such as mapping a continuous set of values to a smaller (and countable) set of values. Herein, the ADC 170 may be a representation of one or more different types of converters to achieve a quantization in different ways, depending on their architecture. For example, the ADC 170 may be a converter optimized to convert analog signals collected by depth sensors.

Operational Flow Overview

Figure 2:
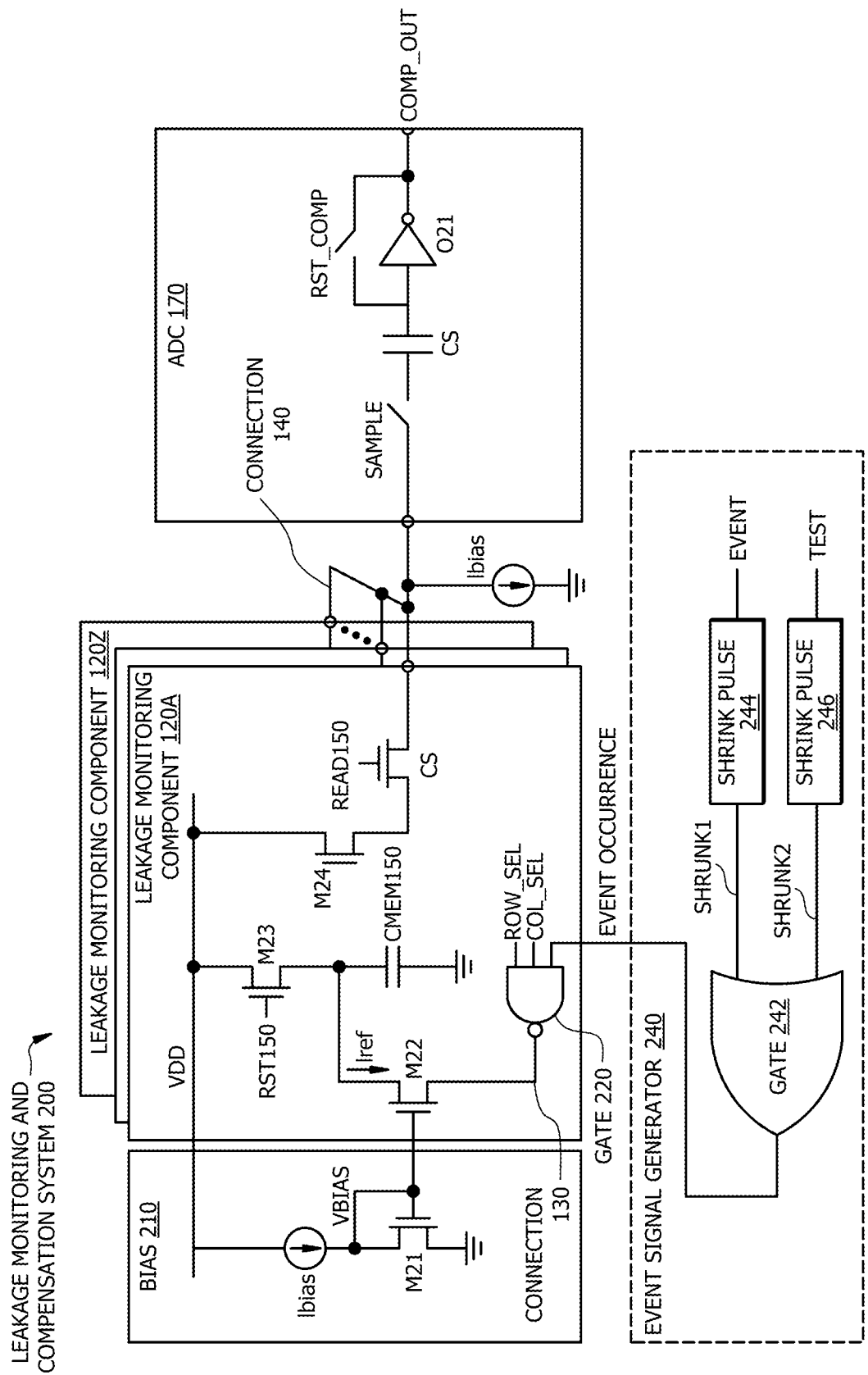
FIG. 2 is a circuit diagram illustrating a leakage monitoring and compensation system, in accordance with one or more embodiments.

FIG. 2 shows a leakage monitoring and compensation system 200, in accordance with one or more embodiments. The leakage monitoring and compensation system 200 includes a bias 210, multiple leakage monitoring components 150A-150Z, the ADC 170, and an event signal generator 240. In one or more embodiments, the leakage monitoring components 150A-150Z may be configured to perform all the functionality described in relation to the leakage monitoring component 150. Each of the leakage monitoring components 150A-150Z may be connected to a corresponding memory unit cell 110. For example, the leakage monitoring component 150A may be coupled to a corresponding memory unit cell 110A (not shown); and the leakage monitoring component 150Z may be coupled to a corresponding memory unit cell 110Z (not shown). As described above, each of the memory unit cells 110 may include multiple memory bins 120.

In the example of FIG. 2, the leakage monitoring components 150A-150Z are connected to the bias 210 and the ADC 170. In some embodiments, all of the leakage monitoring components 150A-150Z may be coupled to a single ADC 170. In yet other embodiments, each of the leakage monitoring components 150A-150Z may be coupled to a corresponding ADC 170A-170Z (not shown).

In some embodiments, the leakage monitoring components 150A-150Z may be multiple memory bins 110 that are connected to the bias 210 and the ADC 170. In some embodiments, all of the memory bins 110 may be coupled to a single ADC 170. In yet other embodiments, the memory bins 110 may be tested in a pre-fabrication stage in the same manner described in relation to leakage monitoring components 150A. In one or more embodiments, one of the leakage monitoring components 150A-150Z is in an ON state while the others are in an OFF state. FIG. 2 illustrates a non-limiting representation of the connections between the leakage monitoring components 150A-150Z and the ADC 170 where the multiple leakage monitoring components 150A-150Z are connected to the ADC 170. In other embodiments, each of the multiple leakage monitoring components 150A-150Z is connected to a dedicated ADC (not shown).

The bias 210 may include a current generator Ibias and a transistor M21. In FIG. 1, a first terminal of the current generator Ibias is connected to a voltage source VDD; and a second terminal of the current generator Ibias is connected to the transistor M21. A source of the transistor M21 is connected to ground, a gate of the transistor M21 is connected to the leakage monitoring components 150A-150Z, and a drain of the transistor M21 is connected to the second terminal of the current generator Ibias and the gate of the transistor M21. In some embodiments, the bias 210 generates a bias voltage VBIAS and provides the bias voltage VBIAS to the leakage mentoring components 150A-150Z via the gate of the transistor M21. Further, the current generator Ibias may provide a bias current to the connection 240.

In the example of FIG. 1, the leakage mentoring components 150A-150Z may include similar elements to those discussed in relation to the leakage mentoring component 150 of FIG. 1. In some embodiments, the leakage mentoring component 150A includes a transistor M22, a transistor M23, a transistor M24, a transistor M25, and a memory capacitor CMEM150. Further, the leakage mentoring component 150A is shown to include a gate 220 connected to the transistor M22 via the connection 130.

In the leakage monitoring component 150A, a source of the transistor M22 is connected to the gate 220 via the connection 130; a gate terminal of the transistor M22 is connected to a first input receiving the bias voltage VBIAS from the bias 210; and a drain of the transistor M22 is connected to the transistor M23, the transistor M24, and the memory capacitor CMEM150. A source of the transistor M23 is connected to the drain of the transistor M22, the transistor M24, and the memory capacitor CMEM150; a gate terminal of the transistor M23 is connected to a second input receiving the reset pulse RST150 from the processing device; and a drain of the transistor M23 is connected to the voltage source VDD. A source of the transistor M24 is connected to the transistor M25; a gate terminal of the transistor M24 is connected to the drain of the transistor M22, a source of the transistor M23, and the memory capacitor CMEM150; and a drain of the transistor M23 is connected to the voltage source VDD. A source of the transistor M25 is connected to the ADC170 via the connection 140; a gate terminal of the transistor M25 is connected to a third input receiving the read pulse READ150 from the processing device; and a drain of the transistor M25 is connected to the source of the transistor M24. A first terminal of the memory capacitor CMEM150 is connected to the drain of the transistor M22, the source of the transistor M23, and the gate of the transistor M24; and a second terminal of the memory capacitor CMEM150 is connected to ground.

The event signal generator 240 may include a gate 242, a shrink pulse 244, a shrink pulse 246, an event input EVENT, and a test input TEST. The event input may receive an event pulse EVENT from a sensing portion associated with the memory unit cell 110. The test input may receive an test pulse TEST from a processing device configured to generate multiple test events. In FIG. 1, the shrink pulse 244 and the shrink pulse 246 may be configured to shrink pulses to normalize a duration of each pulse received. For example, the shrink pulse 244 and the shrink pulse 246 may be configured to shrink durations of signals to a duration equal to p=1 s. The shrink pulse 244 may receive the event pulse EVENT at a first terminal and generate a shrunk event pulse SHRUNK1 at a second terminal. The shrink pulse 246 may receive the test pulse TEST at a first terminal and generate a shrunk event pulse SHRUNK2 at a second terminal. In some embodiments, the gate 242 may be configured to receive at least two inputs and generate at least one output based on the two inputs. A first input of the gate 242 may be connected to the second terminal of the shrink pulse 244. A second input of the gate 242 may be connected to the second terminal of the shrink pulse 246. The output of the gate 242 may be connected to the leakage mentoring components 150A-150Z. The gate 242 may be configured to perform the functionality of a logical OR gate. As such, the gate 242 outputs a high setting (i.e., binary value 1) as long as the gate 242 receives at least one high setting at the inputs. Further, the gate 242 outputs a low setting (i.e., binary value 0) only in cases that the gate 242 receives low settings at the inputs.

The event signal generator 240 may be configured to provide the output of the gate 242 to the leakage mentoring components 150A-150Z. In FIG. 1, the output of the event signal generator 240 is labeled as EVENT OCCURRENCE. In the leakage mentoring component 150A, the output EVENT OCCURRENCE is received as an input of the gate 220. In some embodiments, the gate 220 may be configured to receive at least three inputs and generate at least one output based on the three inputs. A first input of the gate 220 may be configured to receive a row selection command ROW_SEL from the processing device. A second input of the gate 220 may be configured to receive a column selection command COL_SEL from the processing device. The third input may be the output EVENT OCCURRENCE from the event signal generator 240. The output of the gate 220 may be connected to the source of the transistor M22. The gate 220 may be configured to perform the functionality of a logical NAND gate. As such, the gate 220 outputs a low setting (i.e., binary value 0) as long as the gate 220 receives only high settings at the inputs. Further, the gate 242 outputs a high setting (i.e., binary value 1) in cases that the gate 220 receives at least one low setting at the inputs. The row selection command ROW_SEL and the column selection command COL_SEL may be used to select a specific leakage monitoring component 150A-150Z. In some embodiments, the event signal generator may be incorporated in the processing device.

In FIG. 1, the ADC 170 includes a sample switch configured to receive a sampling pulse SAMPLE, a sample capacitor CS, a reset switch configured to receive a reset pulse RST_COMP, and an amplifier O21. The ADC 170 may be configured to receive an input via the connection 140 and provide (i.e., transmit) an output COMP_OUT in a signal output.

Example Operational Flow

In one or more embodiments, the leakage monitoring component 1560A may discharge the memory capacitor CMEM150 in cases when the connection 130 is at a low setting. The voltage of the memory capacitor CMEM150 may be reset in cases when the reset pulse RST150 is at a high setting. The voltage of the memory capacitor CMEM150 may be shared with the ADC 170 when the read pulse READ150 is at a high setting. At the ADC 170, if the sampling pulse SAMPLE is at a high setting, the sample switch may be closed; and if the sampling pulse SAMPLE is at a low setting, the sample switch may be opened. The comparison capacitor CS may receive the value of the memory capacitor CMEM150 when the sampling pulse SAMPLE is at a high setting because the sample switch is closed.

During a first exposure period, the memory capacitor CMEM150 may be discharged over a first period of time. The memory capacitor CMEM150 may be discharged by each EVENT OCCURRENCE received. In this regard, the memory capacitor CMEM150 may be artificially (i.e., without being required to store any specific information during a sensing event caused by the sensor) discharged over a number of N pulses during the exposure window until a voltage in the memory capacitor CMEM150 reaches a first voltage value of V1. After the first voltage value V1 is reached, the read pulse READ150 is triggered to store the first voltage value V1 in the sample capacitor CS of the ACD 170. The N pulses are leak events triggered by the processing engine. Each pulse may be considered a unit of memory leakage. After storing the first voltage value of V1 in the sample capacitor CS of the ACD 170, the memory capacitor CMEM150 may be exposed to multiple sensing events triggered by sensing physical phenomena during field operations.

During a second exposure window, the memory capacitor CMEM150 may be discharged over a second period of time. The memory capacitor CMEM150 may be discharged by each EVENT OCCURRENCE received. In this regard, the memory capacitor CMEM150 may be actually (i.e., being required to store a specific information during a sensing event caused by the sensor) discharged a number of M pulses during the exposure window until a voltage in the memory capacitor CMEM150 reaches a second voltage value of V2. The second value V2 is detected by comparing a voltage in the memory capacitor CMEM150 to the first voltage value V1 in the sample capacitor CS until the first voltage value V1 is lower than the voltage in the memory capacitor CMEM150. At each sensing event, the ADC 170 may count the number of M pulses. Given that the M pulses are sensing events triggered by actual sensing operations, and that each pulse may be shrunk to meet a duration of the units of memory leakage, a difference between V1 and V2 may be considered to represent a value of leakage in the memory capacitor CMEM150.

A compensation value may be determined from the difference between a number of counts it took the N pulses to reach the first voltage V1 and a number of counts it took the M pulses to reach the second voltage V2. The first count may be referred to as a reference counter and the second count may be referred to a measurement counter. As described above, these compensation values may change based on a temperature of the memory array.

General Signaling Flow

Figure 3:
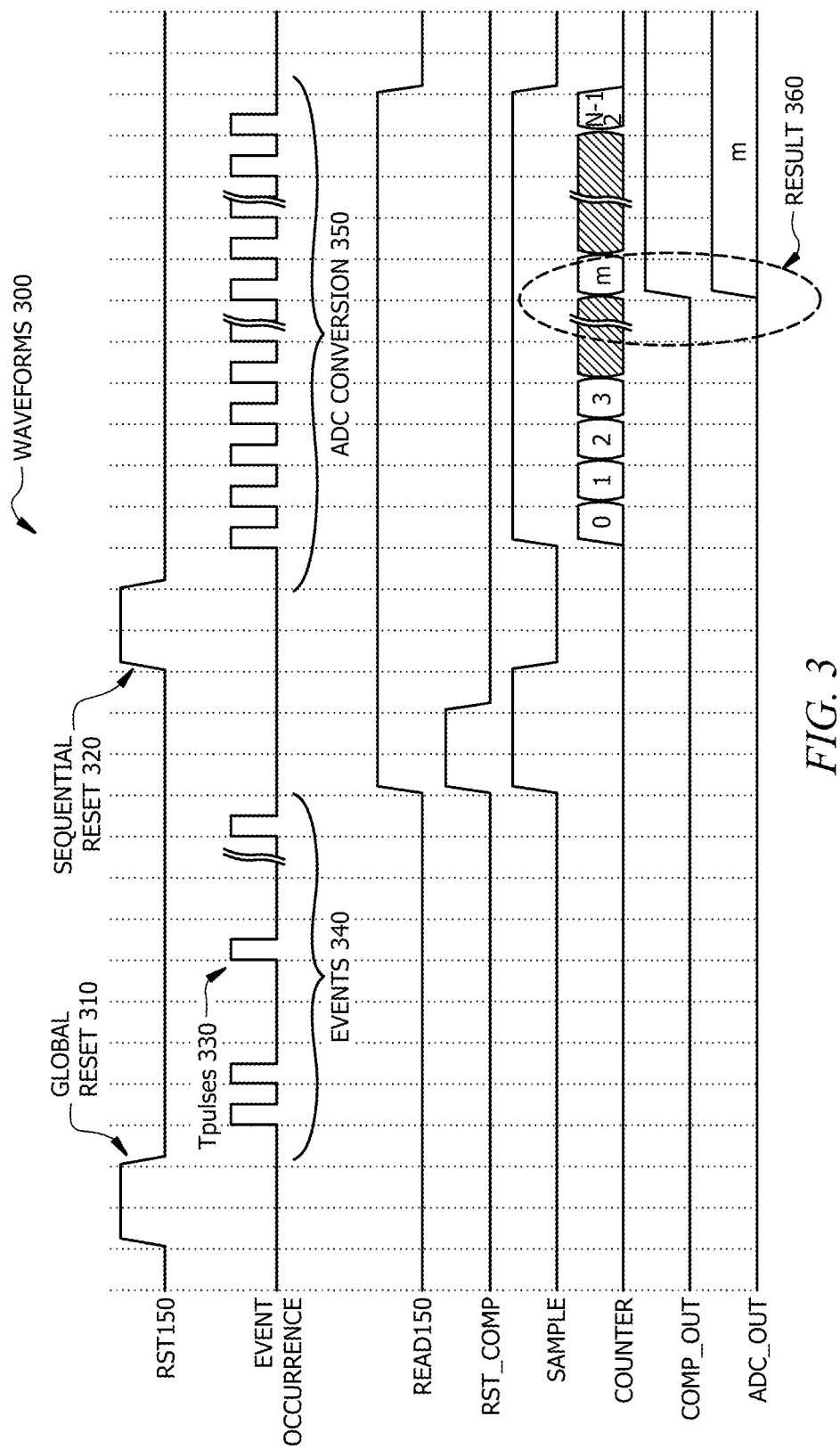
FIG. 3 is a waveform illustrating an process for determining one or more leakage compensation values, in accordance with one or more embodiments.

FIG. 3 shows waveforms 300 representing a general signaling flow to estimate and compensate for leakage current in a field environment, in accordance with one or more embodiments. The waveforms 300 include labels for multiple signals described in reference to FIGS. 1 and 2. In waveform 300, a reset pulse RST150 is set to a high setting during a global reset 310 to start a leakage estimation and compensation operation. The reset pulse RST150 resets the value at the memory capacitor CMEM150. Once the global reset 310 ends, the EVENT OCCURRENCES signal is artificially set to a high setting over multiple events 340. In the example of FIG. 3, these events 340 are time pulses Tpulses 330 of equal duration. As described above, each event out of the events 340 discharges the memory capacitor CMEM150. Further, these events 340 are generated to estimate the leakage of the memory capacitor CMEM150. In one or more embodiments, the events 340 are sensed inputs which may be random in nature for being generated based on a sensed physical stimuli. After a predetermined amount of time (i.e., the duration of an exposure period), the read pulse READ150 is set to a high setting to copy the voltage value at the memory capacitor CMEM150 into the sample capacitor CS in the ADC170. The sampling pulse SAMPLE and the reset pulse RST_COMP are set to a high setting to reset a pulse tracker COUNTER.

At this point, the reset pulse RST150 is set to high once again for the duration of a sequential reset 320, which allows for real sensing events to be discharge the memory capacitor CMEM150. During multiple ADC conversions 350, the changing voltage value of the memory capacitor CMEM150 is compared to the first voltage value V1 stored in the sample capacitor CS. The ADC170 tracks this voltage value in the pulse tracker COUNTER until the memory capacitor reaches a second voltage value V2. V2 is lower than V1, because V2 is the voltage value that the memory capacitor CMEM150 reaches when a given ADC conversion 350 causes the memory capacitor CMEM150 to meet or go below the first voltage value V1.

In the example of FIG. 3, the result 360 shows that the pulse tracker COUNTER counted M pulses before the memory capacitor CMEM150 reached the second voltage value V2. At this point, the output COMP_OUT may indicate that the second voltage value V2 is reached and the output ADC_out may provide the total number of M pulses it took to reach the second voltage value V2.

Example Signal Flow

Figure 4:
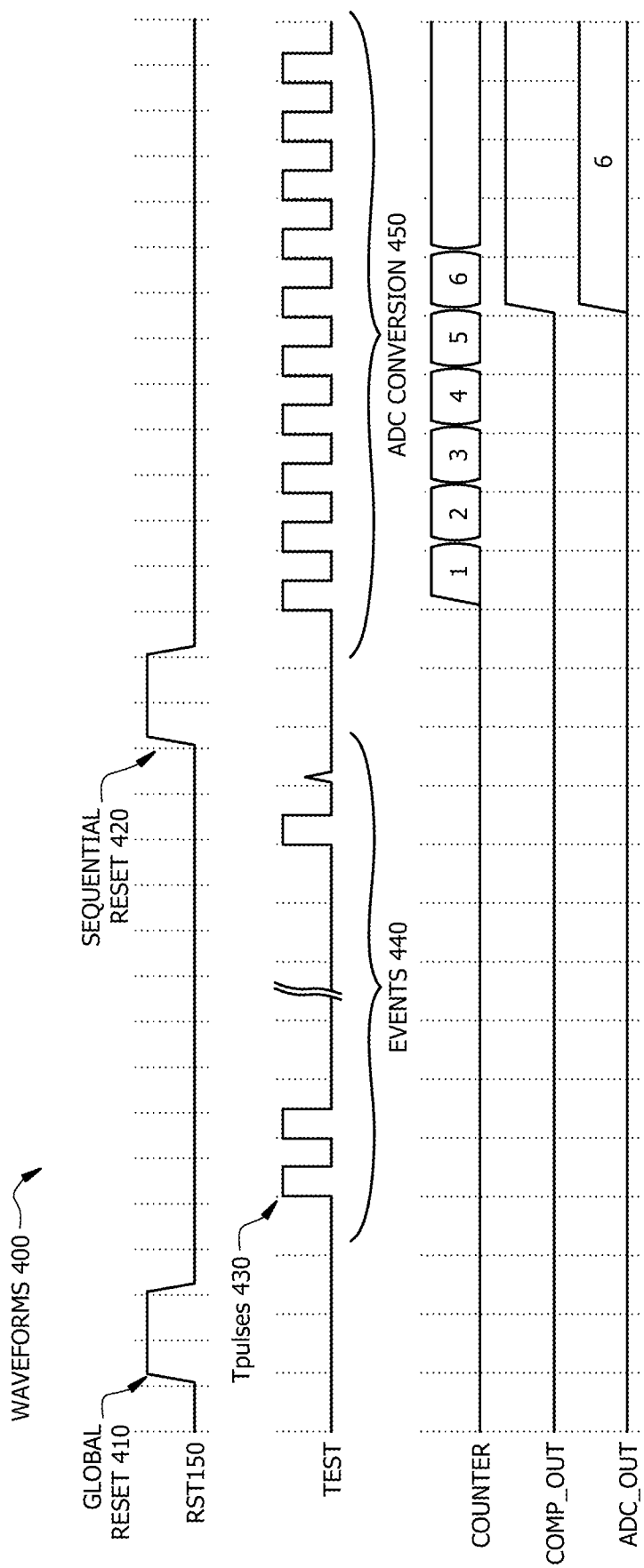
FIG. 4 is a waveform illustrating an example of the process in FIG. 3.

FIG. 4 shows waveforms 400 representing an example signaling flow to estimate and compensate for leakage current in a testing environment, in accordance with one or more embodiments. The waveforms 400 include labels for multiple signals described in reference to FIGS. 1 and 2. In waveform 400, a reset pulse RST150 is set to a high setting during a global reset 410 to start a leakage estimation and compensation operation. The reset pulse RST150 resets the value at the memory capacitor CMEM150. Once the global reset 410 ends, the test signal TEST is set to a high setting over multiple test events 440. In the example of FIG. 4, these events 440 are three time pulses Tpulses 430 of equal duration. In one or more embodiments, the events 440 are predetermined inputs which may be controlled for being generated based on a predefined logic. As described above, each event out of the events 340 discharges the memory capacitor CMEM150. Further, these events 440 are generated to estimate the leakage of the memory capacitor CMEM150. After a predetermined amount of time (i.e., the duration of an exposure period), the read pulse READ150 is set to a high setting to copy the voltage value at the memory capacitor CMEM150 into the sample capacitor CS in the ADC170.

At this point, the reset pulse RST150 is set to high once again for the duration of a sequential reset 420, which allows for preprogrammed sensing events to be discharge the memory capacitor CMEM150. During multiple ADC conversions 450, the changing voltage value of the memory capacitor CMEM150 is compared to the first voltage value V1 stored in the sample capacitor CS. The ADC170 tracks this voltage value in the pulse tracker COUNTER until the memory capacitor reaches a second voltage value V2. V2 is lower than V1, because V2 is the voltage value that the memory capacitor CMEM150 reaches when a given ADC conversion 450 causes the memory capacitor CMEM150 to meet or go below the first voltage value V1.

In the example of FIG. 4, the pulse tracker COUNTER counts six pulses before the memory capacitor CMEM150 reached the second voltage value V2. At this point, the output COMP_OUT indicates that the second voltage value V2 is reached and the output ADC_out provides a number six representing the total number of M pulses it took to reach the second voltage value V2. In this example, the compensation value is equal to the total number of M pulses minus a number of Tpulses 430. In this case: $Comp_{value}=6-3=3$. As described above, the compensation value compensates for leakage current estimated in the memory array. If related to an adjustment command incorporated in a leakage compensation operation, the compensation value may correct any count of three sensing events to a new value of six sensing events.

Example Compensation Tables

TABLE 1 shows an example of a leakage compensation table that has been systematically populated for six memory unit bins 120 of a memory unit cell 110. As described above, in some embodiments, one or more memory bins may be tested during a pre-fabrication stage to determine compensation values for different test counts. In other embodiments, a leakage monitoring component 150 is incorporated into a memory cell unit 110 to generate compensation values in real time. In TABLE 1, the compensation values of memory bins identified as Alpha, Bravo, Charlie, Delta, Echo, Foxtrot, and Golf may be determined using the method and system described in reference to FIGS. 1-4.

TABLE 1

| BIN IDENTIFIER | REF. COUNTER | MEASUREMENT/ TEST COUNTER | COMPENSATION VALUE |
| --- | --- | --- | --- |
| Alpha | 3 | 6 | 3 |
| Bravo | 7 | 22 | 15 |
| Charlie | 3 | 20 | 17 |
| Delta | 4 | 25 | 21 |
| Echo | 6 | 7 | 1 |
| Foxtrot | 4 | 19 | 15 |
| Golf | 6 | 15 | 9 |

TABLE 2 shows an example of a temperature-specific leakage compensation table that has been systematically populated for six memory unit bins 120 of a memory unit cell 110. As described above, in some embodiments, one or more memory bins may be tested during a pre-fabrication stage at specific temperature values to determine compensation values for different test counts. In other embodiments, a leakage monitoring component 150 is incorporated into a memory cell unit 110 to generate compensation values in real time for different temperature values. In TABLE 2, the compensation values of memory bins identified as Alpha, Bravo, Charlie, Delta, Echo, Foxtrot, and Golf may be determined using the method and system described in reference to FIGS. 1-4. As shown in TABLE 2, higher temperature levels lead to higher leakage current that, in turn, necessitates larger compensation values.

TABLE 2

| UNIT CELL IDENTIFIER | UNIT CELL TEMP. | REF. COUNTER | MEASURE- MENT COUNTER | COMPEN- SATION VALUE |
| --- | --- | --- | --- | --- |
| Alpha | 27° C. | 3 | 3 | 0 |
| Bravo | 72° C. | 7 | 32 | 25 |
| Charlie | 44° C. | 5 | 10 | 5 |
| Delta | 55° C. | 8 | 12 | 4 |
| Echo | 67° C. | 6 | 27 | 21 |
| Foxtrot | 88° C. | 4 | 40 | 36 |
| Golf | 31° C. | 15 | 16 | 1 |

Example Processes

Figure 5:
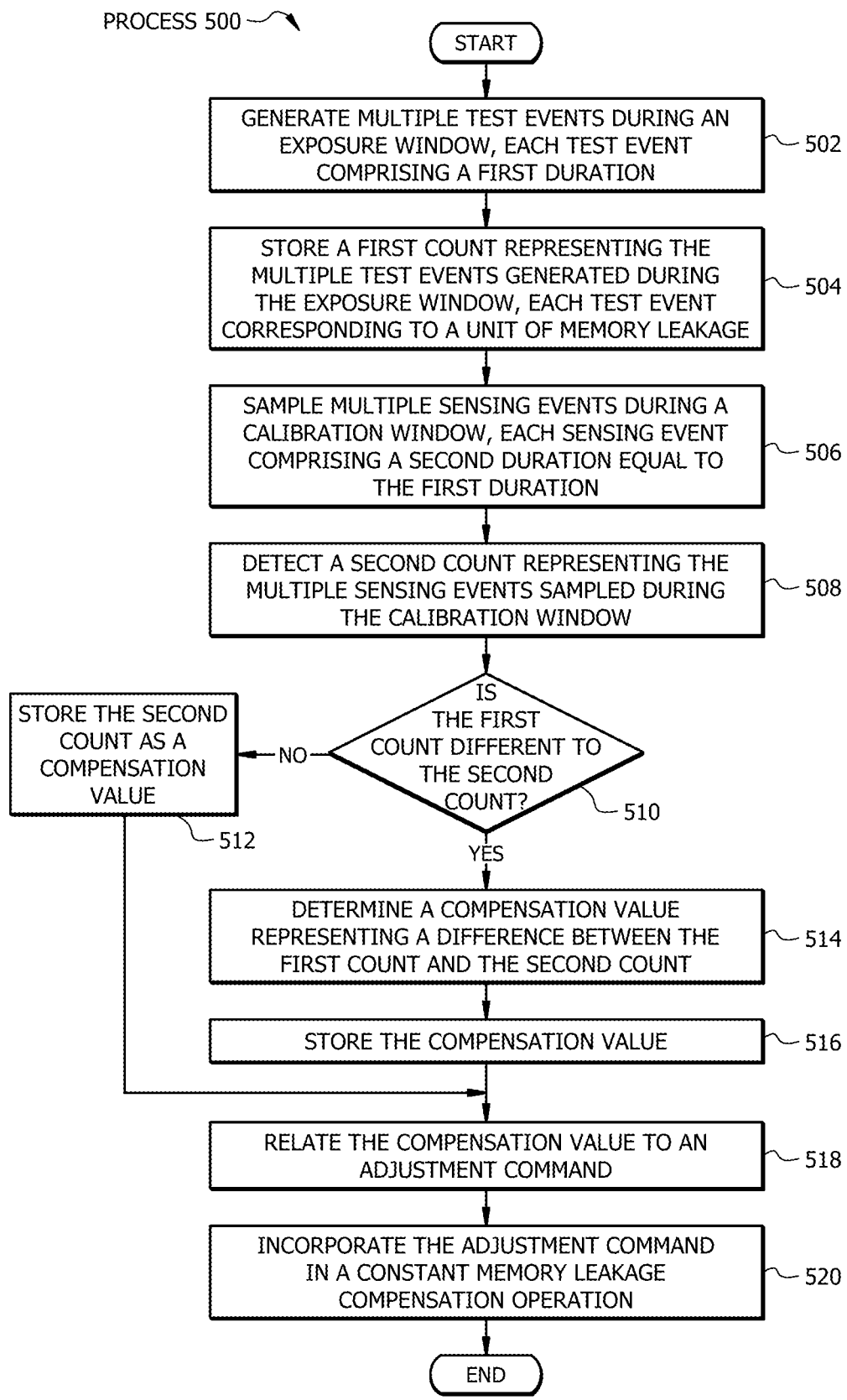
FIG. 5 is a flowchart illustrating a first process for estimating and compensating leakage in memory unit cells, in accordance with one or more embodiments.
Figure 6:
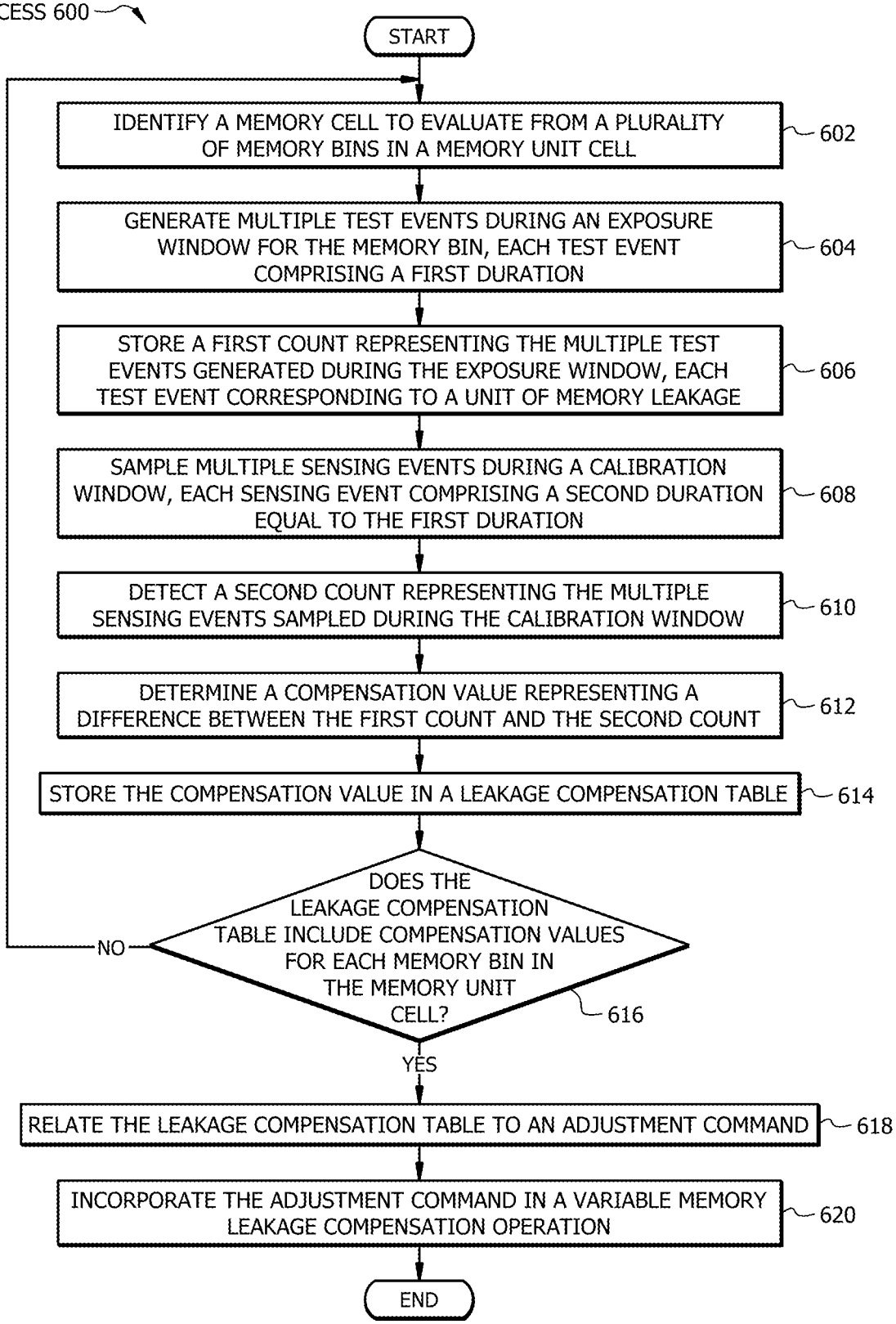
FIG. 6 is a flowchart illustrating a second process for estimating and compensating leakage in memory unit cells, in accordance with one or more embodiments.
Figure 7:
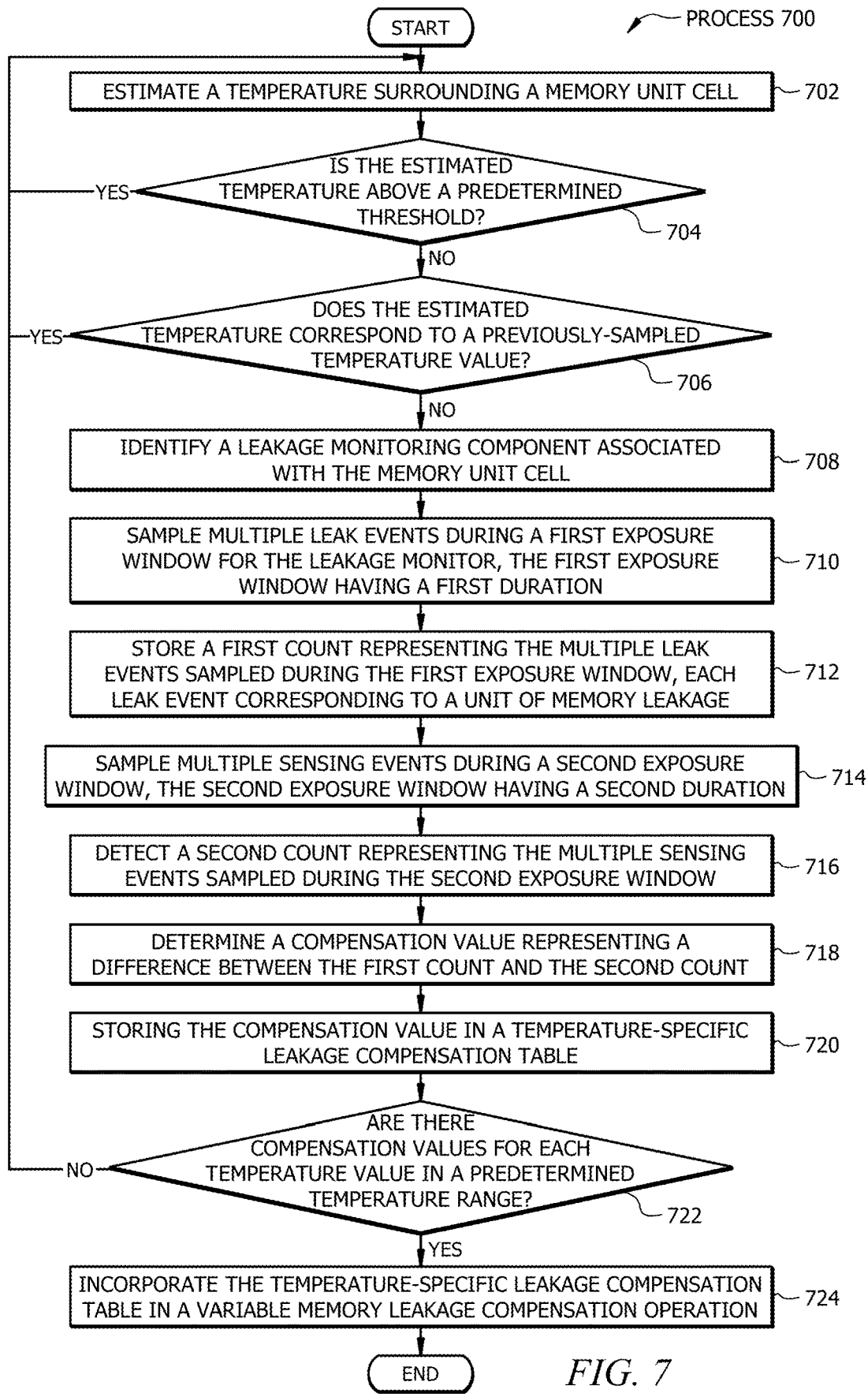
FIG. 7 is a flowchart illustrating a third process for estimating and compensating leakage in memory unit cells, in accordance with one or more embodiments.

FIGS. 5-7 illustrate respective example flowcharts of a process 500, a process 600, and a process 700, in accordance with one or more embodiments. Modifications, additions, or omissions may be made to the processes 500, 600, and 700. The processes 500, 600, and 700 may include more, fewer, or other operations than those shown below. For example, operations may be performed in parallel or in any suitable order. While at times discussed as the memory unit cell 110, the leakage monitoring component 150, the ADC 170, or components of any of thereof performing operations described in the operations, any suitable system or components of the monitoring and compensating system may perform one or more operations of the processes 500, 600, and 700. For example, one or more operations of the processes 500, 600, or 700 may be implemented, at least in part, in the form of software instructions, stored on non-transitory, tangible, machine-readable media that when run by one or more processors may cause the one or more processors to perform operations described in operations 502-520, operations 602-620, or operations 702-724.

Example Process for Generating a Normalized Compensation Value

FIG. 5 illustrates an example process 500 for estimating and compensating for leakage current, in accordance with one or more embodiments. In some embodiments, the process 500 may be implemented to estimate and compensate for a constant memory leak. Under the process 500, a total amount of leakage current is detected during an exposure time. In a factory or analog circuit design facility, a two stage process may be implemented to determine the leakage current over the exposure time. In a first phase, a fixed number of pulses may be sent to the leakage monitoring component 150 during the exposure time until the memory capacitor CMEM150 reaches a first voltage value V1. The first voltage value V1 is recorded by the ADC 170. At this stage, the first voltage V1 is stored in the memory capacitor CMEM150 as a second voltage V2. In a second phase, a series of event pulses are sent to the memory capacitor CMEM150 until the second voltage V2 is equal to or larger than the first voltage V1 saved in the ADC 170. A number of event counts minus a value N is a count equivalent of the leakage current. This process 500 prevents constant leakage currents during the exposure period from affecting measurements performed by memory bins 120.

The process 500 may begin at operation 502, where the leakage monitoring component 150 generates multiple test events during an exposure window. Each test event may include a first time duration. At operation 504, the leakage monitoring component 150 may store a first count representing the test events generated during the exposure window. Each test event may correspond to a unit of memory leakage. At operation 506, the leakage monitoring component 150 may sample multiple sensing events during a calibration window. Each sensing event may include a second duration equal to the first duration. At operation 508, the leakage monitoring component 150 may detect a second count representing the sensing events sampled during the calibration window.

The process 500 may continue at operation 510, where the leakage monitoring component 150 determines whether the first count is different to the second count. In some embodiments, the leakage monitoring component 150 determines whether the first count is equal to the second count. If the first count is equal to the second count, the process 500 may continue to operation 512. If the first count is different to the second count, the process 500 may continue to operations 514 and 516. After the operation 512 or the operation 516, the process 500 proceeds to operation 518. At operation 512, a processing device may store the second value as a compensation value. At operation 514, the processing device may determine a compensation value representing a difference between the first count and the second count. At operation 516, the processing device may store the compensation value. At operation 518, the processing device may relate the compensation value to an adjustment command.

The process 500 may conclude at operation 520, where the processing device may incorporate the adjustment command in a constant memory leakage compensation operation.

Example Process for Generating Multiple Compensation Values

FIG. 6 illustrates an example process 600 for estimating and compensating for leakage current, in accordance with one or more embodiments. In some embodiments, the process 600 may be implemented to estimate and compensate for variable memory leaks. Under the process 600, a total amount of leakage current is detected during an exposure time. In a case where there is little to no leakage during the exposure time, the process 600 assumes that leakage current occurs only during idle times. Under the process 600, different number of events may have different amount of idle time and leakage. As such, the process 600 may include generating or populating a compensation table (i.e., Table 1 described and shown in reference to FIG. 4) that stores different number of events and their corresponding leakage. This table may be generated during a calibration phase in a factory or analog circuit design facility. Under the process 600, the two stage process of process 500 may be implemented to determine the leakage current over different exposure times.

The process 600 may begin at operation 602, where a processing device identifies a memory bin 120A to evaluate from multiple memory bins 120 in a memory unit cell 110. At operation 604, the leakage monitoring component 150 generates multiple test events during an exposure window. Each test event may include a first time duration. At operation 606, the leakage monitoring component 150 may store a first count representing the test events generated during the exposure window. Each test event may correspond to a unit of memory leakage. At operation 608, the leakage monitoring component 150 may sample multiple sensing events during a calibration window. Each sensing event may include a second duration equal to the first duration. At operation 610, the leakage monitoring component 150 may detect a second count representing the sensing events sampled during the calibration window. At operation 612, a processing device may determine a compensation value representing a difference between the first count and the second count. At operation 614, the processing device may store the compensation value in a leakage compensation table.

The process 600 may continue at operation 616, where the processing device determines whether the leakage compensation table includes compensation values for each memory bin in the memory unit cell 110. If the leakage compensation table does not include compensation values, the process 600 may return to operation 602. If the leakage compensation table includes the compensation values, the process 600 may continue to operation 618. At operation 618, the processing device relates the leakage compensation table to an adjustment command.

The process 600 may conclude at operation 620, where the processing device may incorporate the adjustment command in a constant memory leakage compensation operation.

Example Process for Generating Multiple Temperature-Specific Leakage Compensation Values FIG. 7 illustrates an example process 700 for estimating and compensating for leakage current, in accordance with one or more embodiments. In some embodiments, the process 700 may be implemented to estimate and compensate for variable memory leaks at multiple temperature values. In some embodiments, temperature could cause leakage to vary. Under the processor 700, multiple temperature-specific compensation tables may be generated for specific temperature values. Under the process 700, a leakage monitoring components 150 may be coupled as a dummy memory bin for each memory unit cell 110 in a memory array. The leakage monitoring components 150 acting as the dummy memory bin may generate a compensation table (i.e., Table 2 described and shown in reference to FIG. 4) under a current temperature of the memory array at different times over a predefined amount of time. Under the process 700, a total amount of leakage current is detected during an exposure time. Under the process 700, different number of events may have different amount of idle time and leakage. As such, the process 700 includes dynamically (i.e., while the system is in field use) generating or populating the temperature-specific compensation tables to stores different number of events, their corresponding leakages, and corresponding temperature values. This table may be generated during a calibration phase in a factory or analog circuit design facility.

The process 700 may begin at operation 702, where one or more sensors estimate a temperature surrounding a memory unit cell 110. At operation 704, a processing device may determine whether the estimated temperature is above a predetermined threshold. If the estimated temperature is equal to or greater than the predetermined threshold, the process 700 may return to the operation 702. If the estimated temperature is less than the predetermined threshold, the process 700 may continue to the operation 706. At operation 706, the processing device determines whether the estimated temperature corresponds to a previously-sampled temperature value. If the estimated temperature is already sampled, the process 700 may return to the operation 702. If the estimated temperature is not already sampled, the process 700 may continue to the operation 708. At operation 708, the processing engine may identify a leakage monitoring component 150 associated with the memory unit cell 110. At operation 710, the leakage monitoring component 150 may sample multiple leak events during a first exposure window for the leakage monitoring component. At operation 712, the leakage monitoring component 150 may store a first count representing the leak events sampled during the first exposure window. Each leak event may correspond to a unit of memory leakage. At operation 714, the leakage monitoring component 150 may sample multiple sensing events during a second exposure window. The second exposure window may include a second duration. At operation 716, the processing device may detect a second count representing the sensing events sampled during the second exposure window. At operation 718, the processing device may determine a compensation value representing a difference between the first count and the second count. At operation 720, the processing device stores the compensation value in a temperature-specific leakage compensation table.

The process 700 may continue at operation 722, where the processing device determines whether there are compensation values for each temperature value in a predetermined temperature range. If there are no more compensation values left in the predetermined temperature range, the process 700 may return to the operation 702. If there are more compensation values left in the predetermined temperature range, the process 700 may continue to the operation 724.

The process 700 may conclude at operation 724, where the processing device may incorporate the temperature-specific leakage compensation table in a variable memory leakage compensation operation.

Systems and Methods

Figure 8:
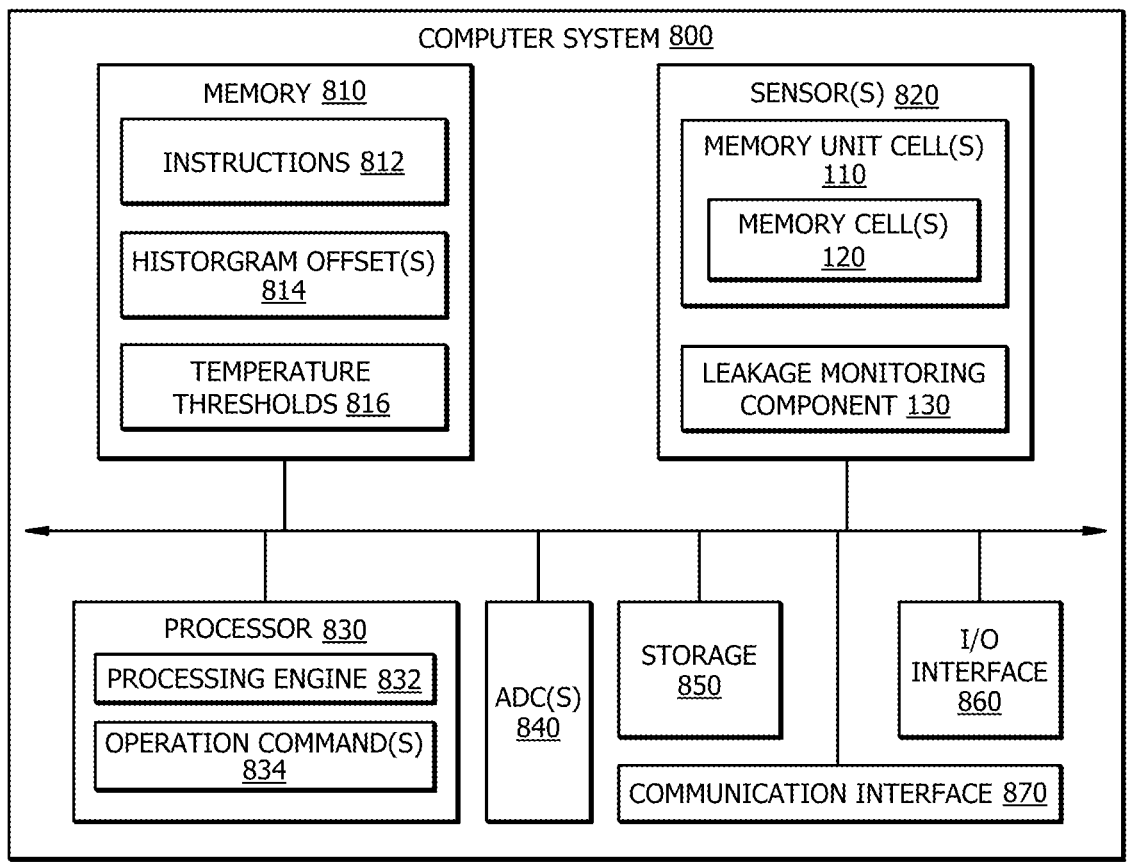
FIG. 8 is a block diagram illustrating a computer system, in accordance with one or more embodiments.

FIG. 8 illustrates an example computer system 800, in accordance with one or more embodiments. This disclosure contemplates a computer system 800 taking any suitable physical form. As example and not by way of limitation, the computer system 800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, the computer system 800 may include one or more computer systems 800; be unitary or distributed; span multiple locations; span multiple machines; span multiple data centers; or partially reside in a cloud, which may include one or more cloud components in one or more networks. Where appropriate, the one or more computer systems 800 may perform without substantial spatial or temporal limitation one or more operations of one or more methods described or illustrated herein. As an example and not by way of limitation, the one or more computer systems 800 may perform in real time or in batch mode one or more operations of one or more methods described or illustrated herein. One or more computer systems 800 may perform at different times or at different locations one or more operations of one or more methods described or illustrated herein, where appropriate.

Although this disclosure describes and illustrates a particular computer system 800 having a particular number of particular components in a particular arrangement, this disclosure contemplates any suitable computer system having any suitable number of any suitable components in any suitable arrangement.

In some embodiments, the computer system 800 comprises a memory 810, one or more sensors 820, a processor 830, one or more ADCs 840, a storage 850, an input (I)/output (O) interface 870, and a communication interface 870. The one or more ADCs 840 may be one or more converters such as the ADC 170 described in reference to FIGS. 2-4. The one or more sensors 840 may be one or more sensors such as the depth sensors described in reference to FIGS. 2-4. Each of the one or more sensors 820 may include one or more memory arrays 110 with their respective one memory unit cells 120. Further, each of the one or more sensors 820 may include one or more leakage monitoring components 150.

In some embodiments, the processor 830 may be the processing device described in reference to FIGS. 1-6. The processor 830 includes hardware for executing multiple instructions 812, such as those making up a computer program. As an example and not by way of limitation, to execute the instructions 812, the processor 830 may retrieve (or fetch) the instructions 812 from an internal register, an internal cache, the memory 810, or the storage 850; decode and execute them; and then write one or more results to another internal register, an internal cache, the memory 810, or the storage 850. In other embodiments, the processor 830 may include one or more internal caches for data, additional instructions, or addresses. The processor 830 may include any suitable number of any suitable internal caches, where appropriate. As an example and not by way of limitation, the processor 830 may include one or more instruction caches, one or more data caches, and one or more translation lookaside buffers (TLBs). Additional instructions in the instruction caches may be copies of the instructions 812 in the memory 810 or the storage 850, and the additional instruction caches may speed up retrieval of the instructions 812 by the processor 830. Data in the data caches may be copies of data in the memory 810 or the storage 850 for the instructions 812 executed by a processing engine 832 at the processor 830 to operate on; the results of previous instructions executed at the processor 830 for access by subsequent instructions executing at the processor 830 or for writing to the memory 810 or the storage 850; or other suitable data. The data caches may speed up read or write operations by the processor 830. The TLBs may speed up virtual-address translation for the processor 830. Although this disclosure describes and illustrates a particular processor, this disclosure contemplates any suitable processor.

In one or more embodiments, the processor 830 comprises one or more operation commands 834. The one or more operation commands 834 may include commands described in reference to FIGS. 1-6. These commands may include reset commands generating inputs for the reset pulse RST120, the reset pulse RST150, and the reset pulse RST_COMP; read commands generating inputs for the read pulse READ120 and the read pulse READ150; row selection commands generating inputs for the row pulse ROW_SEL; column selection commands generating inputs for the column pulse COL_SEL; sampling commands generating inputs for the sampling pulse SAMPLE; and the test control commands TEST. In some embodiments, the commands may be binary signal transmission values transmitted at a same time or at different times. For example, a time t=1 ms, the commands may be a high setting or a low setting in accordance with the instructions 812.

In particular embodiments, the memory 810 includes main memory for storing the instructions 812 and operations for the processor 830 to execute or data for the processor 830 to operate on. As an example, and not by way of limitation, the computer system 800 may load the instructions 812 from the storage 850 or another source (such as, for example, another computer system 800) to the memory 810. The processor 830 may then load the instructions 812 from the memory 810 to the internal register or internal cache. To execute the instructions 812, the processor 830 may retrieve the instructions 812 from the internal register or internal cache and decode them. During or after execution of the instructions 812, the processor 830 may write one or more results (which may be intermediate or final results) to the internal register or internal cache. The processor 830 may then write one or more of those results to the memory 810. In other embodiments, the processor 830 executes only instructions in one or more internal registers or internal caches or in the memory 810 (as opposed to the storage 850 or elsewhere) and operates only on data in one or more internal registers or internal caches or in the memory 810 (as opposed to the storage 850 or elsewhere). One or more memory buses (which may each include an address bus and a data bus) may couple the processor 830 to the memory 810.

In particular embodiments, one or more memory management units (MMUs) reside between the processor 830 and the memory 810 and facilitate accesses to the memory 810 requested by the processor 830. In particular embodiments, the memory 830 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. The memory 810 may include one or more memories 830, where appropriate. Although this disclosure describes and illustrates particular memory, this disclosure contemplates any suitable memory.

In particular embodiments, the storage 850 includes mass storage for data or instructions. As an example and not by way of limitation, the storage 850 may include a hard disk drive (HDD), a floppy disk drive, flash memory, an optical disc, a magneto-optical disc, magnetic tape, or a Universal Serial Bus (USB) drive or a combination of two or more of these. The storage 850 may include removable or non-removable (or fixed) media, where appropriate. The storage 850 may be internal or external to computer system 800, where appropriate. In particular embodiments, the storage 850 is non-volatile, solid-state memory. In particular embodiments, the storage 850 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass the storage 850 taking any suitable physical form. The storage 850 may include one or more storage control units facilitating communication between the processor 830 and the storage 850, where appropriate. Where appropriate, the storage 850 may include one or more storages 870. Although this disclosure describes and illustrates particular storage, this disclosure contemplates any suitable storage.

In some embodiments, the communication interface 860 includes hardware, software, or both providing one or more interfaces for communication (such as, for example, packet-based communication) between the computer system 800 and one or more other computer systems 800 or one or more networks. As an example and not by way of limitation, the communication interface 870 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 870 for it. As an example and not by way of limitation, the computer system 800 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, the computer system 800 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. The computer system 800 may include any suitable communication interface 870 for any of these networks, where appropriate. Although this disclosure describes and illustrates a particular communication interface 870, this disclosure contemplates any suitable communication interface.

In particular embodiments, the I/O interface 870 includes hardware, software, or both, providing one or more interfaces for communication between the computer system 800 and one or more I/O devices. The computer system 800 may include one or more of these I/O devices, where appropriate. One or more of these I/O devices may enable communication between a person and the computer system 800. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more additional sensors. This disclosure contemplates any suitable I/O devices and any suitable I/O interfaces 870 for them. Where appropriate, the I/O interface 870 may include one or more device or software drivers enabling the processor 830 to drive one or more of these I/O devices. The I/O interface 870 may include one or more I/O interfaces 870, where appropriate. Although this disclosure describes and illustrates a particular I/O interface, this disclosure contemplates any suitable I/O interface.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

MISCELLANEOUS

As used herein, the terms "terminal", "node", "interconnection", "pin" and "lead" are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit ("IC") package) and may be adapted to be coupled to at least some of the passive elements and/or the sources to form the described structure either at a time of manufacture or after a time of manufacture, for example, by an end-user and/or a third-party.

A transistor includes three terminals—a control terminal and a pair of current terminals. In the case of a field effect transistor, the control terminal is the gate, and the current terminals are the drain and source. In the case of a bipolar junction transistor, the control terminal is the base, and the current terminals are the emitter and collector.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors ("BJTs")).

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed:

1. A method performed by a leakage monitoring and compensation system, comprising:
    identifying a leakage monitoring component associated with a memory unit cell;
    sampling a plurality of leak events during a first exposure window, the first exposure window comprising a first duration;
    storing a first count representing the plurality of leak events sampled during the first exposure window, each leak event corresponding to a unit of memory leakage;
    sampling a plurality of sensing events during a second exposure window, the second exposure window comprising a second duration;
    detecting a second count representing the plurality of sensing events sampled during the second exposure window;
    determining a compensation value representing a difference between the first count and the second count;
    storing the compensation value as a leakage-adjustment value in a temperature-specific leakage compensation table; and
    incorporating the temperature-specific leakage compensation table in a variable memory leakage compensation operation.

2. The method of claim 1, further comprising:
    in conjunction with identifying the leakage monitoring component associated with the memory unit cell, estimating a temperature surrounding the memory unit cell;
    determining that the temperature is above a predetermined threshold; and
    determining whether the temperature is a previously-sampled temperature value.

3. The method of claim 1, further comprising:
    in conjunction with storing the compensation value as the leakage-adjustment value in the temperature-specific leakage compensation table, determining whether the temperature-specific leakage compensation table comprises leakage-adjustment values for each temperature value in a predetermined temperature range.

4. The method of claim 3, further comprising:
    in response to determining that the replacing the temperature-specific leakage compensation table comprises leakage-adjustment values for each temperature value in the predetermined temperature range, incorporating the temperature-specific leakage compensation table in the variable memory leakage compensation operation for a predetermined time period.

5. The method of claim 4, further comprising:
    in response to incorporating the temperature-specific leakage compensation table in the variable memory leakage compensation operation for a predetermined time period, placing the leakage monitoring component in an idle state.

6. The method of claim 1, wherein the memory unit cell comprises a plurality of memory bins associated with a sensor.

7. The method of claim 1, wherein the leakage monitoring and compensation system is in an idle state prior to identifying the leakage monitoring component associated with the memory unit cell.

8. A leakage monitoring and compensation system, comprising:
    a sensor comprising a plurality of memory unit cells;
    a leakage monitoring component communicatively coupled to the sensor and configured to:
        sample a plurality of leak events during a first exposure window, the first exposure window comprising a first duration;
        store a first count representing the plurality of leak events sampled during the first exposure window, each leak event corresponding to a unit of memory leakage;
        sample a plurality of sensing events during a second exposure window, the second exposure window comprising a second duration; and
        detect a second count representing the plurality of sensing events sampled during the second exposure window;
    a processor communicatively coupled to the sensor and the leakage monitoring component and configured to:
        identify that the leakage monitoring component is associated with a specific memory unit cell of the plurality of memory unit cells;
        determine a compensation value representing a difference between the first count and the second count;
        store the compensation value as a leakage-adjustment value in a temperature-specific leakage compensation table; and
        incorporate the temperature-specific leakage compensation table in a variable memory leakage compensation operation.

9. The system of claim 8, wherein the processor is further configured to:
    in conjunction with identifying the leakage monitoring component associated with the memory unit cell, estimate a temperature surrounding the memory unit cell;
    determine that the temperature is above a predetermined threshold; and
    determine whether the temperature is a previously-sampled temperature value.

10. The system of claim 8, wherein the processor is further configured to:
    in conjunction with storing the compensation value as the leakage-adjustment value in the temperature-specific leakage compensation table, determine whether the temperature-specific leakage compensation table comprises leakage-adjustment values for each temperature value in a predetermined temperature range.

11. The system of claim 10, wherein the processor is further configured to:
    in response to determining that the replacing the temperature-specific leakage compensation table comprises leakage-adjustment values for each temperature value in the predetermined temperature range, incorporate the temperature-specific leakage compensation table in the variable memory leakage compensation operation for a predetermined time period.

12. The system of claim 11, wherein the processor is further configured to:
    in response to incorporating the temperature-specific leakage compensation table in the variable memory leakage compensation operation for a predetermined time period, place the leakage monitoring component in an idle state.

13. The system of claim 8, wherein the memory unit cell comprises a plurality of memory bins associated with the sensor.

14. The system of claim 8, wherein the leakage monitoring and compensation system is in an idle state prior to identifying the leakage monitoring component associated with the memory unit cell.

15. A leakage monitoring and compensation system, comprising:
   a leakage monitoring component configured to:
      sample a plurality of leak events during a first exposure window, the first exposure window comprising a first duration;
      store a first count representing the plurality of leak events sampled during the first exposure window, each leak event corresponding to a unit of memory leakage;
      sample a plurality of sensing events during a second exposure window, the second exposure window comprising a second duration; and
      detect a second count representing the plurality of sensing events sampled during the second exposure window;
   a processor communicatively coupled to the leakage monitoring component and comprising a processing engine configured to perform one or more operations upon executing one or more instructions; and
   a non-transitory computer readable medium storing the one or more instructions that when executed by the processor cause the processor to:
      identify that the leakage monitoring component is associated with a specific memory unit cell of the plurality of memory unit cells;
      determine a compensation value representing a difference between the first count and the second count;
      store the compensation value as a leakage-adjustment value in a temperature-specific leakage compensation table; and
      incorporate the temperature-specific leakage compensation table in a variable memory leakage compensation operation.

16. The system of claim 15, wherein the instructions further cause the processor to:
   in conjunction with identifying the leakage monitoring component associated with the memory unit cell, estimate a temperature surrounding the memory unit cell;
   determine that the temperature is above a predetermined threshold; and
   determine whether the temperature is a previously-sampled temperature value.

17. The system claim 15, wherein the instructions further cause the processor to:
   in conjunction with storing the compensation value as the leakage-adjustment value in the temperature-specific leakage compensation table, determine whether the temperature-specific leakage compensation table comprises leakage-adjustment values for each temperature value in a predetermined temperature range.

18. The system of claim 17, wherein the instructions further cause the processor to:
   in response to determining that the replacing the temperature-specific leakage compensation table comprises leakage-adjustment values for each temperature value in the predetermined temperature range, incorporate the temperature-specific leakage compensation table in the variable memory leakage compensation operation for a predetermined time period.

19. The system of claim 18, wherein the instructions further cause the processor to:
   in response to incorporating the temperature-specific leakage compensation table in the variable memory leakage compensation operation for a predetermined time period, place the leakage monitoring component in an idle state.

20. The system of claim 15, wherein the memory unit cell comprises a plurality of memory bins associated with a sensor.

* * * * *

UNITED STATES PATENT AND TRADEMARK OFFICE
CERTIFICATE OF CORRECTION

PATENT NO.         : 12,073,903 B1
APPLICATION NO.    : 18/172983
DATED              : August 27, 2024
INVENTOR(S)        : Umanath Ramachandra Kamath et al.

Page 1 of 1

It is certified that error appears in the above-identified patent and that said Letters Patent is hereby corrected as shown below:

On the Title Page

In Item (73), under "Assignee", in Column 1, delete "LLP" and insert -- LLC --, therefor.

Signed and Sealed this
Eighth Day of October, 2024

Katherine Kelly Vidal
*Director of the United States Patent and Trademark Office*